(12) United States Patent
Kraz

(10) Patent No.: US 6,762,607 B2
(45) Date of Patent: Jul. 13, 2004

(54) ELECTROSTATIC DISCHARGES AND TRANSIENT SIGNALS MONITORING SYSTEM AND METHOD

(75) Inventor: Vladimir Kraz, Santa Cruz, CA (US)

(73) Assignee: Credence Technologies, Inc., Soquel, CA (US)

( * ) Notice: Subject to any disclaimer, the term of this patent is extended or adjusted under 35 U.S.C. 154(b) by 0 days.

(21) Appl. No.: 10/437,108

(22) Filed: May 12, 2003

(65) Prior Publication Data

US 2003/0201778 A1 Oct. 30, 2003

Related U.S. Application Data

(62) Division of application No. 09/551,412, filed on Apr. 18, 2000, now Pat. No. 6,563,319.
(60) Provisional application No. 60/129,982, filed on Apr. 19, 1999.

(51) Int. Cl.$^7$ .............................................. G01R 29/12
(52) U.S. Cl. ...................................... 324/458; 324/771
(58) Field of Search ................................ 324/771, 419, 324/415, 168, 134

(56) References Cited

U.S. PATENT DOCUMENTS 6,563,319 B1 * 5/2003 Kraz ........................... 324/458

* cited by examiner

Primary Examiner—David A. Zarneke
Assistant Examiner—Trung Q. Nguyen
(74) Attorney, Agent, or Firm—Gray Cary Ware & Freidenrich LLP

(57) ABSTRACT

An ESD and transient signal monitoring system and method are provided wherein an ESD monitoring device may be used to continuously monitor ESD events and generate an indicating of the magnitude of the ESD events. A method for protecting an electronic device from ESD events is also described.

4 Claims, 8 Drawing Sheets

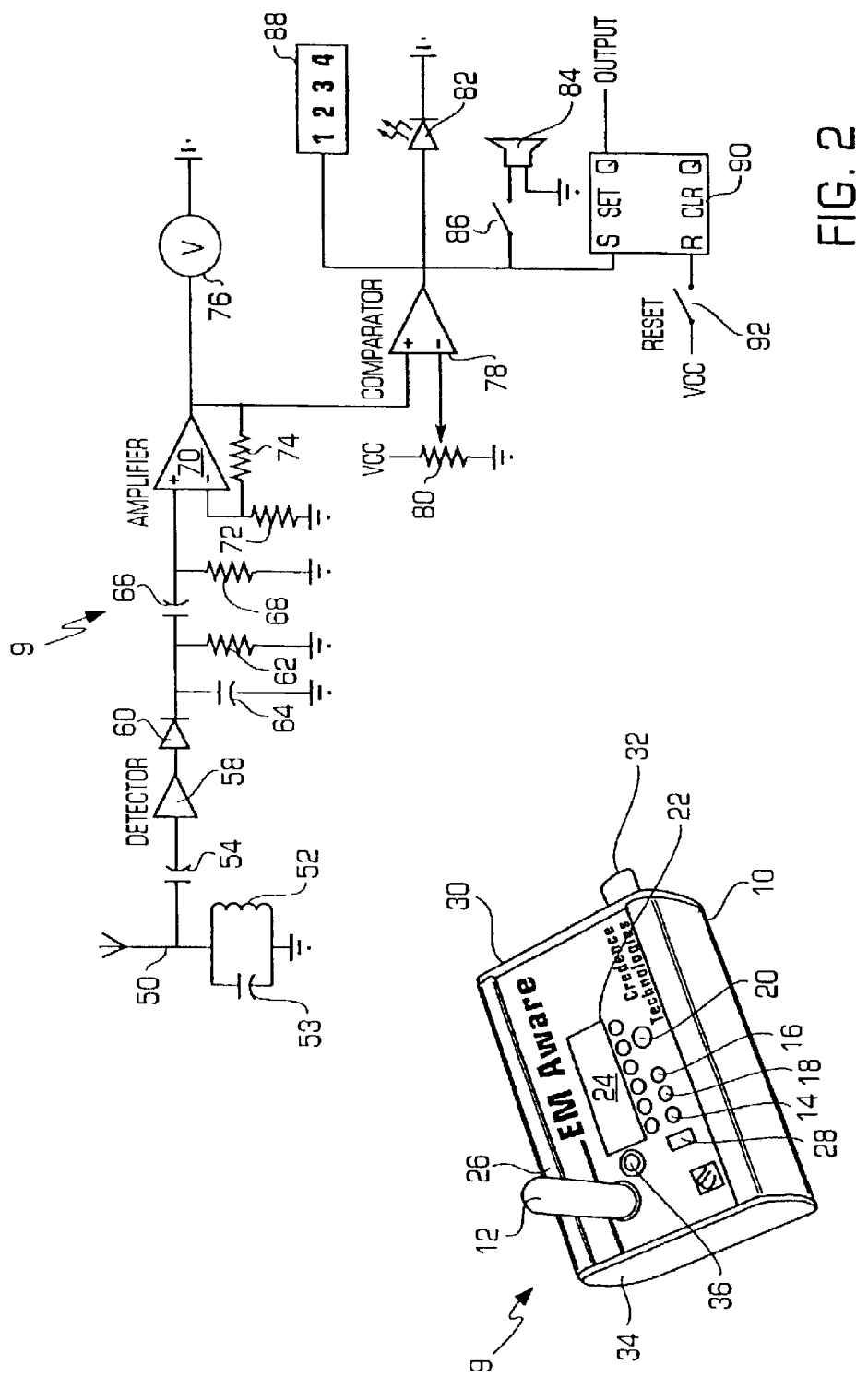

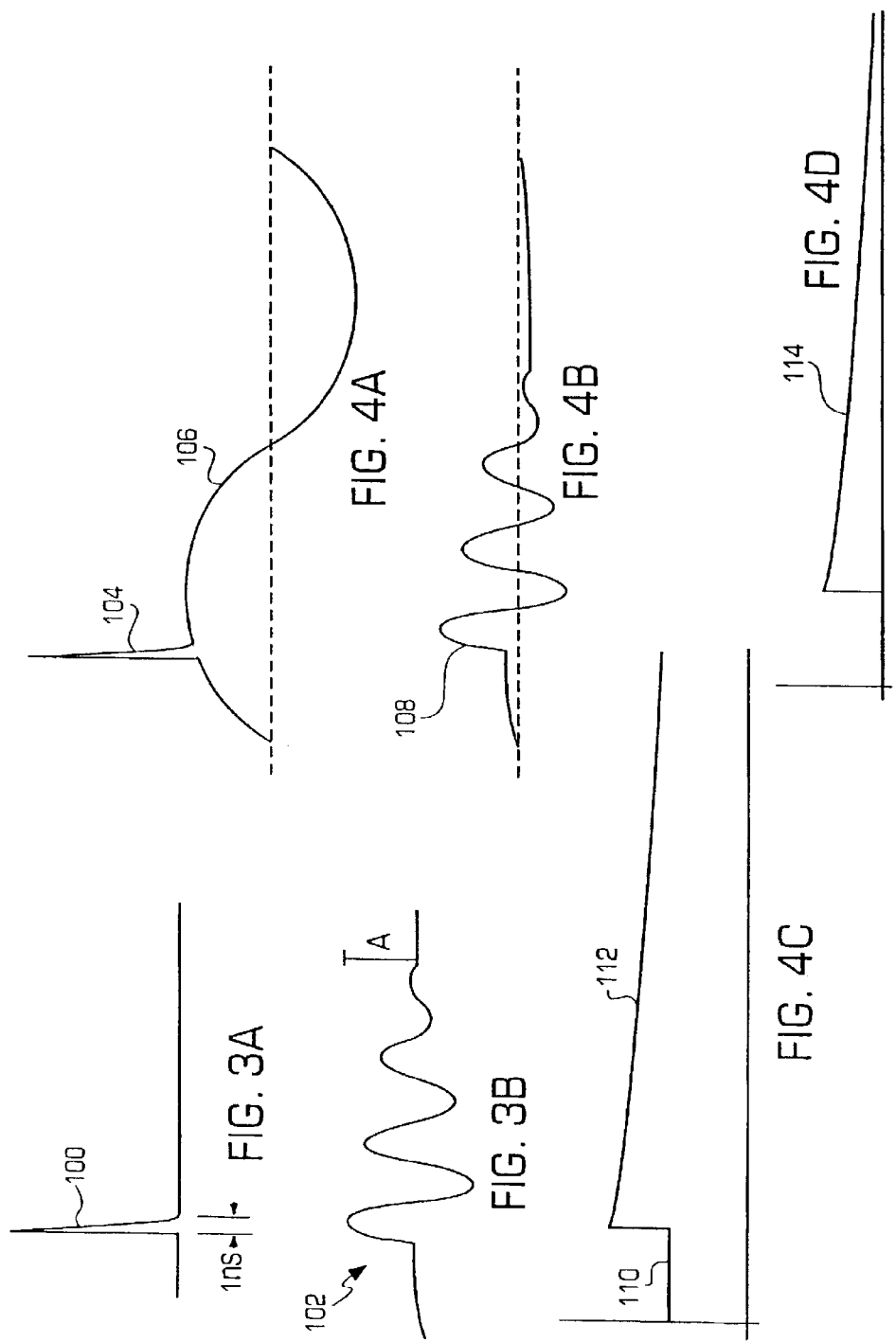

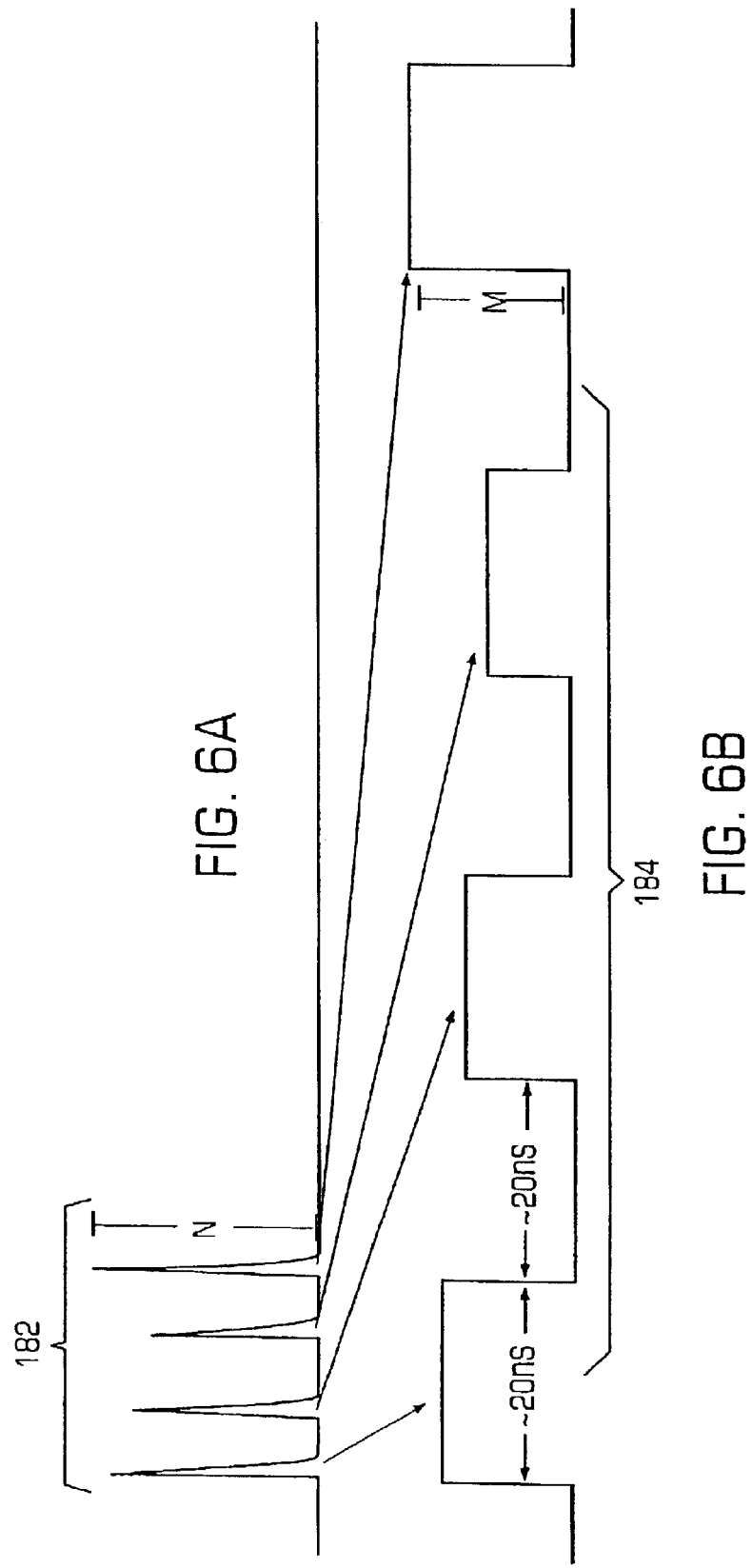

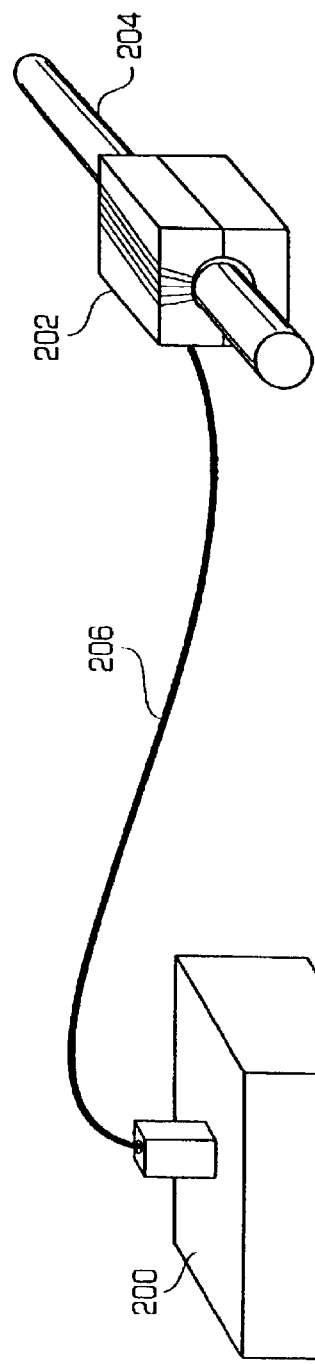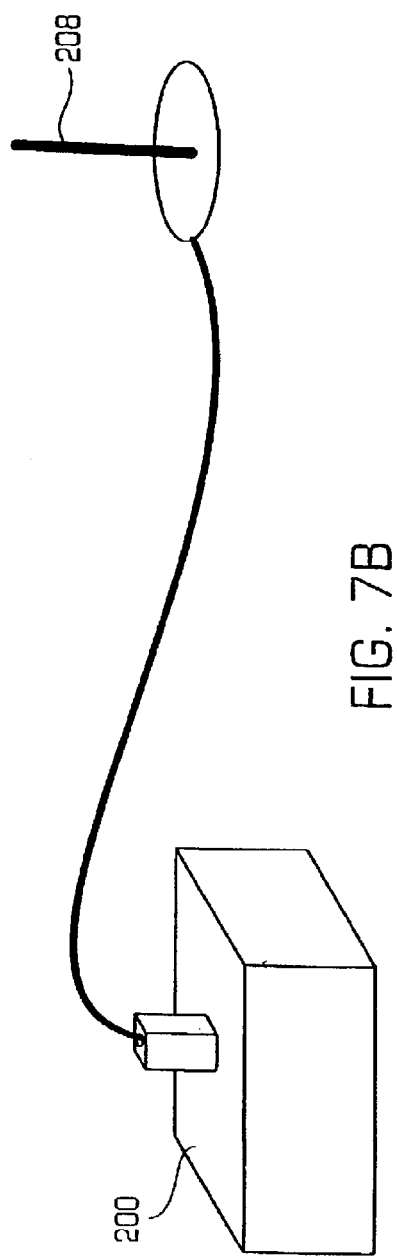

ELECTROSTATIC DISCHARGES AND TRANSIENT SIGNALS MONITORING SYSTEM AND METHOD

RELATED APPLICATIONS

This application is a divisional application of U.S. application Ser. No. 09/551,412 filed Apr. 18, 2000 is now U.S. Pat. No. 6,563,319, which claims the benefit of U.S. Provisional Patent Application Serial No. 60/129,982 filed Apr. 19, 1999 and entitled "Electrostatic Discharge (ESD) Event Monitor).

BACKGROUND OF THE INVENTION

This invention relates generally to a device and a method for detecting Electrostatic Discharges (ESD) and transient signals and for protecting an electronics device from electromagnetic interference associated with the electrostatic discharges and the transient signals.

An electrostatic discharge (ESD) can permanently damage sensitive electronic devices. For example, semiconductor wafers, magnetic heads for disk drives, integrated circuits, other electronic components and circuits, etc. may be damaged by ESDs. For devices that are not damaged by the ESD, it can still disrupt the operation of an electronic circuit. In non-electronic applications, such as powder handling, etc., ESD can be the cause of a fire.

Short transient spike-like signals resulting from ESD events, commutation of electric motors, solenoids, etc. and other sources can also induce damage into electronics devices and cause circuit malfunctions. Surge protectors are commonly used on power lines, however they cannot protect against common-mode surges. In addition, improperly done ground wires do not provide any protection and can also be a conduit for transmitting surges as well.

Presently, the most common method of reducing damages caused by ESD is preventive measures, such as grounding wrist-wraps, conductive chairs, conductive floor coating, ionizers, etc. All of these preventive measures are supposed to reduce or eliminate the build-up of static voltage that causes the discharges. However, the ultimate indication of the effectiveness of the ESD-preventive measures is the lack of an actual occurrence of electrostatic discharges (also known as ESD events). The detection of ESD events, the measurement of the magnitude of the ESD events, and data logging the data associated with the ESD events for future analysis presents valuable information for assessment of the ESD environment, of the ESD protection, of the real-time addressing of the ESD problems, for determining most likely defects due to ESD, and for statistical process analysis. Thus, it is desirable to provide a device for providing the above functions.

The ESD Event detection devices available today, such as Sanki (U.S. Pat. No. 4,631,473) and Lucent's T100 device provide an indication when an ESD event has exceeded a pre-set level. However, these devices merely detect that the ESD Event has occurred without the ability to measure the magnitude of the ESD Event. The knowledge of the magnitude of the ESD Event, however, provides valuable information that is pertinent to the assessment of the potential damage caused by ESD and also the effectiveness of the ESD-preventive measures. In addition, existing devices are geared towards occasional ESD checks, rather than day-to-day ESD monitoring. A device that offers continuous ESD monitoring will offer real-time indication of ESD problems and provides immediate feedback for implementation of ESD-corrective and preventive measures. It is desirable to provide such an ESD monitoring device.

ESD events or surges in wires and cables last for a very short period of time (typically, nanoseconds). This makes it very difficult to provide measurements of the magnitude of the ESD events in a practical cost-effective and user-friendly manner. Often, a high-speed oscilloscope and an antenna are used to capture the waveform of an ESD Event for analysis of its magnitude. This is not practical for everyday use. Thus, it is desirable to provide a device that can measure the ESD events in wires and cables. Thus, it is desirable to provide an ESD and transient signal monitoring system and method that overcomes the above limitation of typical devices and provides the desirable features described above and it is to this end that the invention is directed.

SUMMARY OF INVENTION

A method and the implementation of improved accuracy of the measurement of an ESD event are described. The ESD event monitoring system in accordance with the invention may accurately measure the magnitude of an ESD event signal by receiving the short-duration pulse or surge from the ESD event and causing a longer duration oscillating secondary signal to be generated based on the short-duration pulse. The oscillatory signal may be more easily measured and the magnitude of the oscillatory signal is proportional to the magnitude of the ESD event so that the magnitude of the ESD event may be accurately determined.

Thus, in accordance with the invention, a device for detecting and measuring short pulse-type signals such as ESD Events and surges is provided. The device receives a signal and converts the electromagnetic field into an electric signal. The device then filters the electric signal in order to reject signals with predetermined properties not associated with short transient-type signals and pass only signals with properties associated with short transient-type signals. Finally, the device measures the signal to provide an analog or digital representation of the magnitude of the received filtered signal. In accordance with the invention, the device includes a resonance means that creates, from a short duration received signal, a new secondary self-resonating signal with longer duration having a magnitude that is a function of the magnitude of the received signal, wherein a slower input signals will not create strong secondary resonance signal and will not be measured.

In accordance with another aspect of the invention, a power supply isolation apparatus is provided wherein the apparatus comprises a first switching means that connects a first storage means to the output of a power source and a second switching means that connect said first storage means to a second storage means. The apparatus further comprises the second storage means being connected to the electric load wherein both of the switching means connect the first storage means alternatively to either said power source or to said second storage means in non-overlapping manner so that said first storage means charges from said power supply and discharges into said second storage means in a manner where said second storage means and said electric load are never directly connected to said power supply and no interference signal is passed from said power supply.

BRIEF DESCRIPTION OF DRAWINGS

FIG. 1 illustrates an ESD monitoring device in accordance with the invention;

FIG. 2 is a block diagram illustrating the circuitry of the ESD monitoring device of FIG. 1;

FIGS. 3a, 3b, 4a, 4b, 4c and 4d illustrates examples of an ESD event or transient signal and the associated oscillations that are generated in accordance with the invention;

FIGS. 6a and 6b are diagrams illustrating a transient signal;

FIGS. 7a and 7b are diagrams illustrating the ESD monitoring device with a remote antennae in accordance with the invention;

DETAILED DESCRIPTION OF A PREFERRED EMBODIMENT

Figure 5:
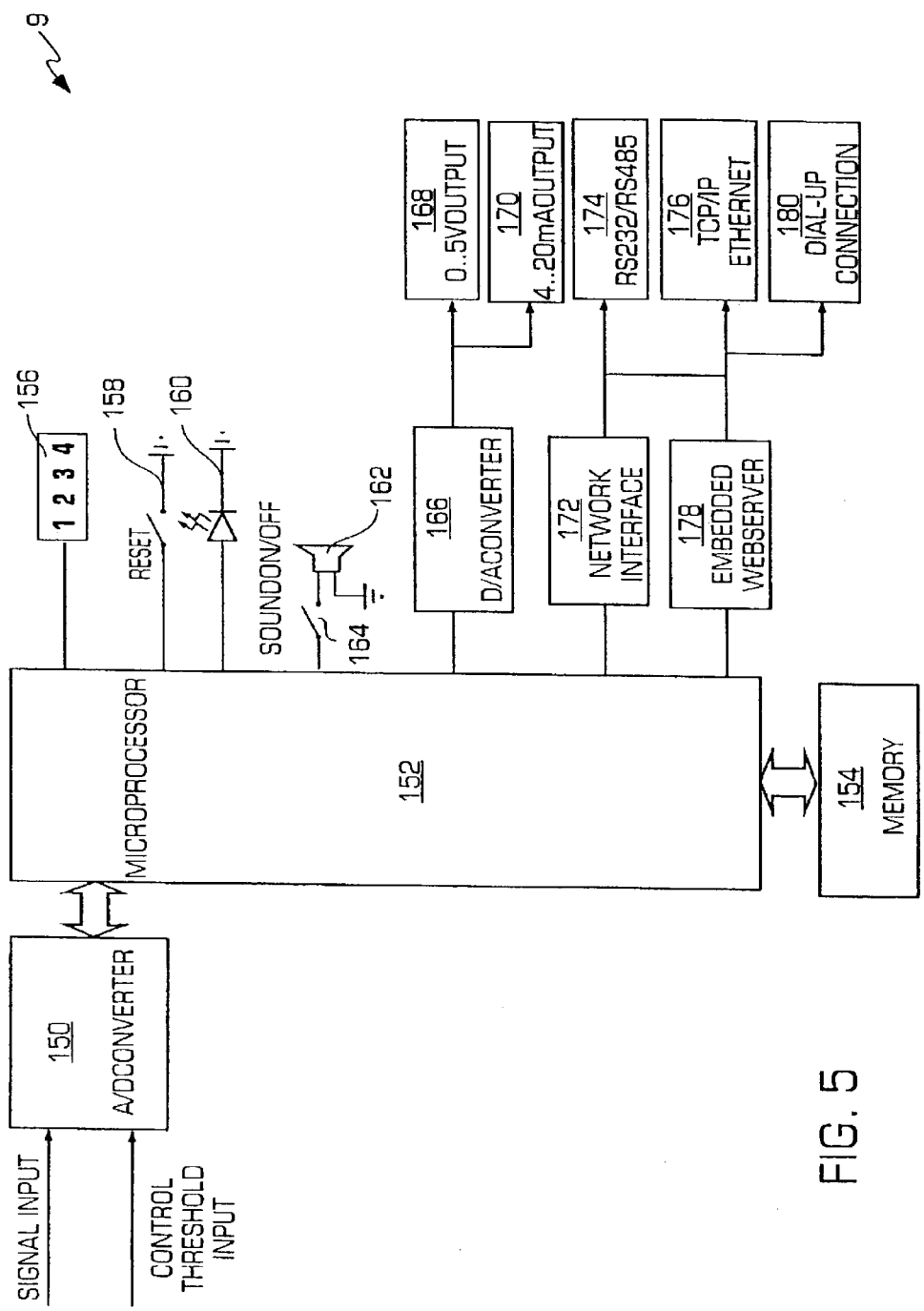
FIG. 5 is a block diagram illustrating another embodiment of the ESD monitoring device in accordance with the invention.

In general, electrostatic discharge (ESD) event detection, monitoring and measurement are done by receiving, processing and analyzing the electromagnetic field generated by the ESD event. Several embodiments of an ESD monitoring device in accordance with the invention for detecting and continuously monitoring an ESD event or transient signal and for measuring the magnitude of the ESD event will now be described. It should be understood that the invention is not limited to the embodiments described below since modifications and enhancements may be made without departing from the scope of the invention.

FIG. 1 is a diagram illustrating an ESD Event monitoring device 9 in accordance with the invention. In this embodiment, the device 9 may include an enclosure 10, an antenna 12 for receiving an electromagnetic field, one or more indicators local to the device, such as a power indicator 14, an ESD Event LED 16 that indicates an ESD Event in progress, a Hold LED 18 that indicates that information about the ESD Event has been captured and stored in the device, a Reset switch 20 to clear the Hold LED, a bar-graph indicator 22 to display the magnitude of the ESD Event, an ESD Event counter 24, a buzzer 26, and a sound on/off switch 28.

The device may further include one or more interfaces including, for example, a power jack 30 for providing external power to the unit, a jack 32 for providing output from the device to an external data acquisition system or a network, and an option/programming connector 34. The device 9 may also include a sensitivity adjustment means 36 for adjusting the sensitivity of the device to ESD events. The actual ESD monitoring device in accordance with the invention may or may not include all of the features as shown in FIG. 1. In operation, the device 9 may detect an ESD event, continuously monitor the ESD event and measure the magnitude of the ESD event as will be described below. Now, an example of the circuitry in the ESD monitoring device will be described.

FIG. 2 is a block diagram of one possible implementation of the ESD event monitor 9 in accordance with the invention. In particular, a receiving means 50, such as an antenna, receives the electromagnetic emissions caused by an electrostatic discharge and converts the emission into electrical signals and passes those electrical signals to a tank comprised of an inductor 52 and a capacitor 53. The capacitor 53 is optional since the antenna and other parts of the circuit provide parasitic capacitance sufficient for operation of the circuit, as it will be explained later in the text. The inductor 52 serves an important purpose of permitting the measurements of extremely short pulses, such as possible ESD Events. In fact, it performs two different functions: it acts as a high-pass filter and also as part of a self-resonance circuit that "rings" at extremely short rise edges of signals characterizing ESD Events. Any signals with slow rising edges will not be able to generate the ringing due to the properly selected inductor value. The inductor 52 then will filter the unwanted signal out so that it will not be detected. This as well as more details on the operation of the circuit will be explained in more detail below. The signal from the inductor 52 will pass through a capacitor 54 to a detector 58 that converts the high-frequency signal into a DC signal.

This DC signal passes from the output of the detector to an anode of a diode 60. The cathode of the diode 60 is connected to a resistor 62 and a capacitor 64. The signal from that point passes through a capacitor 66 to a resistor 68 and a positive input of an operational amplifier 70. The resistor 68 provides a ground reference for the amplifier 70. A feedback resistor 74 together with the resistor 72 controls the gain of the amplifier 70 as is well known. The output of the amplifier 70 is connected to a signal measuring means 76.

The output of the amplifier 70 is also connected to the positive input of a comparator 78. The other input of the comparator 78 is connected to a potentiometer 80 that provides a reference voltage to the comparator. The output of the comparator 78 is connected to one or more different circuits, such as an LED circuit 82 that provides visual indication of an ESD Event, a buzzer 84 via switch 86 to provide audio indication of an ESD Event, an event counter 88 for counting the number of ESD events and a set input of a latching means 90, such as a RS flip-flop as shown in FIG. 2, whose reset input is connected to a switch 92. The latching means will latch the current signal magnitude information so that it is output until the switch 92 is closed that causes the output to be reset to zero. Not shown on the block diagram is a preamplifier that could be put after the antenna 50 in order to provide amplification of the incoming signal if the level of measured signal is too low to be otherwise detected.

The main difficulty in detecting and measuring ESD Events and short transient signals is that the signal generated by such events lasts only a few nanoseconds. This makes it extremely difficult to measure and characterize the signal using a typical reasonable priced detecting means. In particular, conventional A/D converters that allow measurement of such short duration signals are very expensive and consume very high amount of current which drains a battery very quickly. (e.g., the A/D converter MAX104 by Maxim costs several hundred dollars and consumes 1A at 5V). In addition, conventional peak-hold circuits cannot adequately store the peak of a nanosecond-long signal due to insufficient signal duration time and droop rate. This makes conventional technology impractical to become economical solution.

The ESD monitoring device in accordance with the invention measures the magnitude of ESD Events by making the ESD Event generate a secondary signal dependent of the ESD signal that lasts longer that the ESD event so that it can be measured in an affordable and a practical manner. In particular, a very short ESD event pulse induces oscillations in the tank formed by inductor 52 and optional capacitor 53. These oscillations typically have a frequency that is determined by the self-resonance of the tank. As described above, the capacitor 53 is optional since the required capacitance for the tank is easily formed by a capacitance of antenna 50 to the ground or by traces on the circuit board. The oscillations induced by the short ESD event pulse last a sufficient amount of time (e.g., hundreds of nanoseconds or even microseconds) so that they can be detected and measured by typical high-speed detector circuits without resorting to ultra-fast power-hungry and costly means.

FIGS. 3a and 3b are illustrations of the transient signal 100 generated by an ESD event (See FIG. 3a) and an oscillatory signal 102 (See FIG. 3b) generated in accordance with the invention, respectively. In particular, a typical pulse 100 generated by an ESD Event is shown in FIG. 3a that has a 1 nS width. FIG. 3b shows the secondary signal 102—ringing—(oscillations) induced by the pulse 100. The duration of the ringing is sufficiently longer than the pulse so that the secondary signal's amplitude, A, may be measured. The magnitude of the self-oscillations (secondary signal 102) is a direct function of the magnitude of the pulse so that the magnitude of the pulse 100 may be easily determined. This technique allows the ESD event to be detected (as with conventional systems) and, in addition, the measurement of the magnitude of the ESD Events and surges is made in accordance with the invention.

Another difficulty in measuring the ESD events and surges is that background continuous wave signals heavily interfere with the measurements of the weaker ESD event signals. In accordance with the invention, however, the inductor 52 acts as a high-pass filter to reject signals that were not caused by ESD or surges. This further helps to differentiate the lower-frequency continuous-wave signals (which are filtered out by the inductor 52) from the short-duration, higher frequency ESD events and surges.

Returning to FIG. 2, the detector 58 may be implemented using any conventional detector suitable for common radio frequency range signals. The practical embodiment of the ESD monitoring system in accordance with the invention may utilize a logarithmic detector that provides a DC voltage output in logarithmic proportion to the magnitude of the input signal. Thus, a logarithmic detector, such as Analog Device's AD8307 and similar, can expand the dynamic range of the measurements.

The diode 60 in conjunction with the capacitor 64 establishes a DC reference level that is a function of the background continuous-wave signals. The response of the detector 58 to a short pulse causes a momentary increase in the voltage on the capacitor 64. This pulse then is able to pass through the capacitor 66 to the DC amplifier built into the operational amplifier (op-amp) 70 and associated components. When only a continuous-wave signal is present, the voltage on the capacitor 64 is constant and there is no signal on the input of the op-amp 70. When a surge or ESD event is present, the op-amp 70 receives the signal and amplifies it to the level necessary for further indication, etc. The capacitor 64 holds the voltage from the pulse long enough to measure its magnitude. An additional conventional peak-hold circuit can be utilized to further extend the duration of the DC voltage representing ESD Event.

FIGS. 4a–d illustrate the waveforms of the ESD event or surge signal occurring while a continuous-wave signal is present. As seen in FIG. 4a, an ESD-induced pulse 104 is superimposed onto a continuous-wave signal 106. After inductor 52, the pulse generates a ringing secondary signal 108 as shown in FIG. 4b. The inductor 52 acts as a high-pass filter and attenuates the lower-frequency continuous wave signal. FIG. 4c shows a voltage on the capacitor 64. As shown, the continuous-wave signal generated a steady DC voltage 110 on the capacitor 64 prior to arrival of the pulse. The pulse then creates a slowly decaying "step" voltage 112. After passing the capacitor 66, the DC component is blocked and only a "step" signal 114 remains to be further amplified and measured. The decay rate of the "step" signal is determined by the values of the capacitor 64 and the optional resistor 62.

Returning to FIG. 2, the signal measuring device 76, that may be a voltmeter, may be connected to the output of the op-amp 70 and may be either digital or fast analog with optional max/hold capability to display the magnitude of the ESD Event or a surge. The comparator 78 provides a digital logic-level signal that indicates that an ESD event or a surge has exceeded the threshold set by the potentiometer 80 or other means of providing the threshold voltage. This logic-level signal can be used for counting the number of ESD events using the counter 88, the visual indication with LED circuit 82 (current-limiting resistor not shown for simplification), the audio indication utilizing buzzer 84. The latching means 90, a flip-flop in the diagram, provides "memory" that an ESD event happened. The output from the flip-flop 80 can be used for audio and visual indication as well. Flip-flop can be reset with switch 92. Now, another embodiment of the ESD monitoring system in accordance with the invention that is an extension of the system shown in FIG. 2 will be described.

FIG. 5 depicts another embodiment of the ESD monitoring system 9 in accordance with the invention including further extensions of the block diagram. In particular, the signal from the op-amp 70 of the FIG. 2 is passed to the input of an A/D converter 150 that is connected to a microprocessor 152. The microprocessor has a memory 154 that may be internal to the microprocessor or external to the microprocessor. The output ports of the microprocessor are connected to an event counter 156 that can be of any known conventional design and driven by the microprocessor, a reset switching means 158 to reset the ESD event monitor, a visual indication means 160 such as a LED, an audio indication means 162 such as a speaker, a sound on/off switching means 164 and a D/A converter 166. The output of D/A converter is connected to either a 0–5V output circuit 168 or a 4–20 mA output circuit 170. These circuits 168, 170 present the most common interfaces for industrial control networks. Other interfaces are also possible within the framework of the proposed invention. The ports of the microprocessor 152 can also be connected to a network interface 172 and further to a RS232/RS422/RS4845 interface 174 or a TCP/IP network such as 10BaseT 176. Another way to connect proposed invention to the outside world is to combine it with the internet via an embedded web server that can connect the proposed invention to the internet via either Ethernet or similar network or via dial-up connection 180.

ESD Events happen very quickly and a regular data acquisition system (DAQ) cannot record them at high speed. In order to facilitate adequate speed of data inputs to the DAQ, the proposed invention records the magnitude of each event individually as fast as it is capable of recording into its memory and then transmits the data representing each event at slower pace suitable for a conventional data acquisition system on first in, first out basis.

FIGS. 6a and 6b show the principle of the operation of this buffering concept. As seen, an ESD Event-caused pulses 182 happen in rapid succession, typically as close as microseconds apart. The output pulses 184 in this particular embodiment (they are shown in 0–5 V output version—FIG. 5 item 168) are stretched so that they are about 20 mS apart and the duration of each pulse is also about 20 mS. These times may vary depending on the design of the system. The magnitude, M, of each pulse corresponds to the magnitude, N, of the appropriate ESD Event. This way, a conventional data acquisition system can record information about ESD Events without missing a single event.

In order to limit the amount of information supplied to the outside DAQ the proposed invention may provide processed information to the outside world rather than raw information. An example of such processed information may be a value of total energy of ESD events during a period of time rather than information of every single event. This simplifies communication between proposed invention and DAQ. Other processing algorithms are possible and depend on customer's needs. Such processing can be performed by said control means (microprocessor).

An embodiment of the proposed invention may use either a built-in antenna as shown in FIG. 1 or alternatively, the system may have a remote antenna as shown in FIGS. 7a and 7b. For example, FIG. 7a depicts an ESD Event monitor 200 connected to a magnetic field antenna 202 that measures ESD-induced pulses and surges on a cable 204, such as power cable or a ground wire. The magnetic antenna is preferably connected to the monitor via a shielded cable 206. As another example, FIG. 7b depicts the operation of the ESD Event monitor 200 with a remote electric field antenna 208. The antennae 208 can be made very small to fit into tight places such as IC testers, semiconductor manufacturing tools, etc. to be as close to the protected area as possible to maximize the signal received from ESD Event. This increases sensitivity and reduces false triggering. Now, an embodiment of the ESD monitoring system using multiple sensors will be described.

Figure 8:
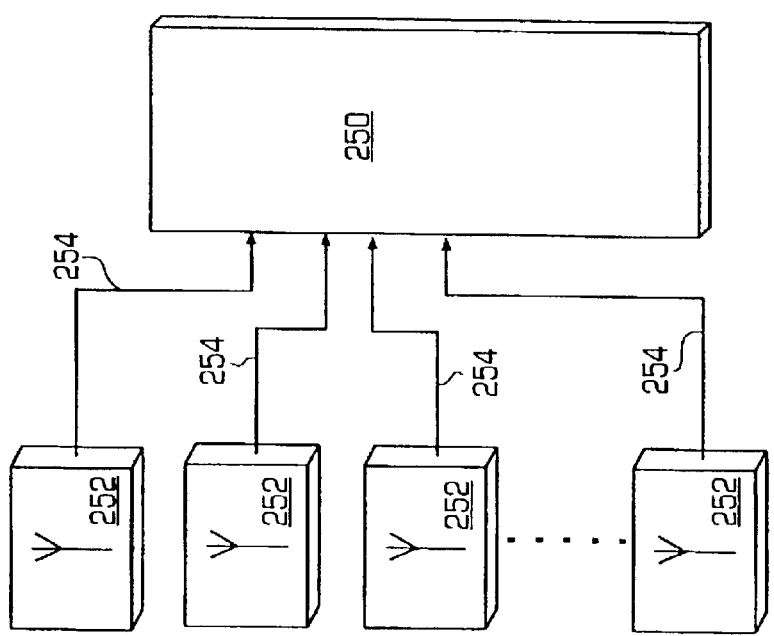
FIG. 8 is a diagram illustrating the ESD monitoring device in accordance with the invention with multiple sensors.

FIG. 8 illustrates another embodiment with multiple sensors 252 connected to the same base unit 250. Thus, the same base unit 250 can be installed, for example, on the IC tester with each sensor 252 installed at a different location within the tester to identify specific sources of ESD events. Each sensor is connected to said base unit via cable 254. For these types of installation, solution of FIG. 8 would be a more economical one since the base unit with interface, etc. would be shared between several sensors.

Figure 9:
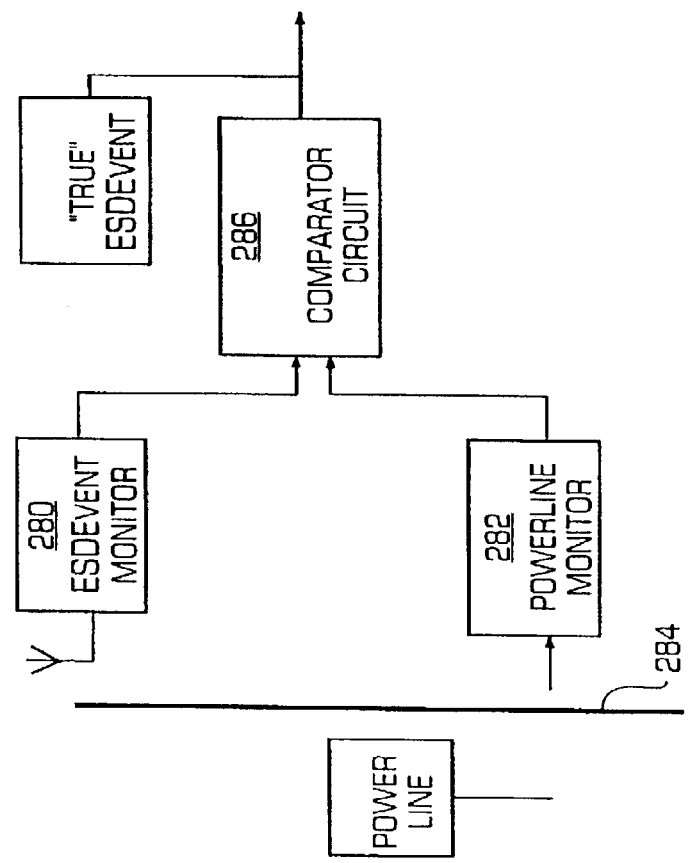
FIG. 9 is a diagram illustrating a technique in accordance with the invention for isolating the ESD event monitor from the power line.

A serious issue for ESD event monitors is that the monitor may mistakenly interpret certain surges and spikes as valid ESD Events. For example, surges or spikes from the power line that supplies power to the monitor can easily be misinterpreted as ESD events. FIG. 9 shows a technique in accordance with the invention to alleviate this false detection problem. In particular, an ESD Event monitor circuit 280 may be coupled with a separate power line monitor 282. The construction of the power line monitor may be similar to that of the ESD event monitor described above. The power line monitor 282 receives signals from a power line 284. A comparator 286 (analog or digital) compares the signals from both of the monitors 280, 282 and, if they happen at the same time and their characteristics are similar, a determination can be made that the event was originated from the power line and is not a valid ESD event. This greatly reduces false triggering due to interference from the noise on the power lines.

Figure 10A:
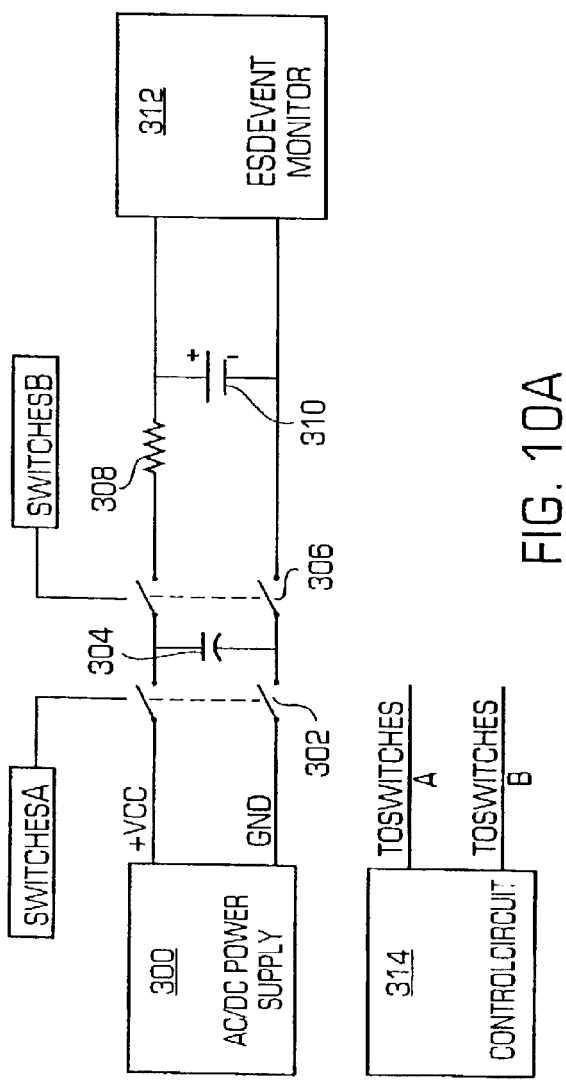
FIGS. 10a and 10b illustrate a first embodiment of an isolated ESD monitoring device in accordance with the invention and timing diagrams for the switches in the device, respectively.
Figure 10B:
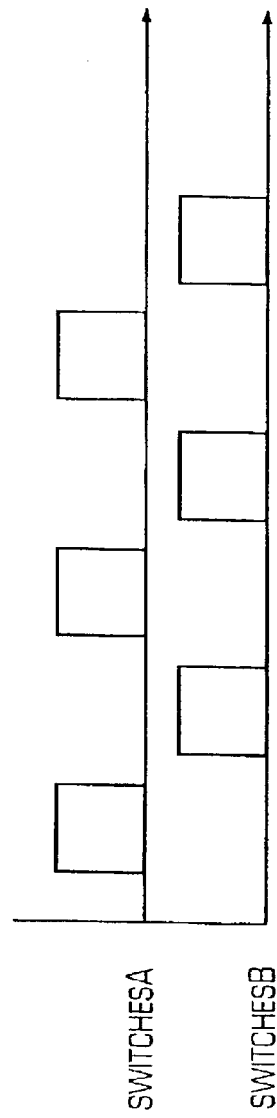

FIGS. 10a and 10b shows a technique in accordance with the invention for completely insulating an ESD event monitor 312 from the power line and from all the interference it introduces. In particular, an AC/DC power supply 300 that supplies power to the ESD event monitor 312 is connected via a first switching means 302 (Switches A) to a transfer storage means (capacitor) 304. On the other side of the transfer storage means 304 is a second switching means 306 (switches B). A second storage means 310, such as rechargeable battery or a large capacitor, is connected to the switching means 306 via an optional current-limiting resistor 308. The ESD event monitor 312 is connected to the second storage means 310. A control circuit 314 provides control signals to both switching means 302, 306.

The switching timing diagram is shown in FIG. 10b. As seen, the switching means operate in a non-overlapping manner. In particular, the first switching means 302 transfer the energy from the power supply 300 into the first storage means 304. Then, the second switching means 306 transfer this energy to the second storage means 310 that provide power to the ESD Event monitor 312. Thus, the ESD event monitor is never connected directly to the power supply. Therefore, no interfering signals can pass through and cause false triggering of the ESD event monitor. The outputs of the ESD event monitor can also be insulated from the "outside world" via opto-couplers (not shown here) so that no interference can pass to the ESD event monitor via any connections.

Figure 11A:
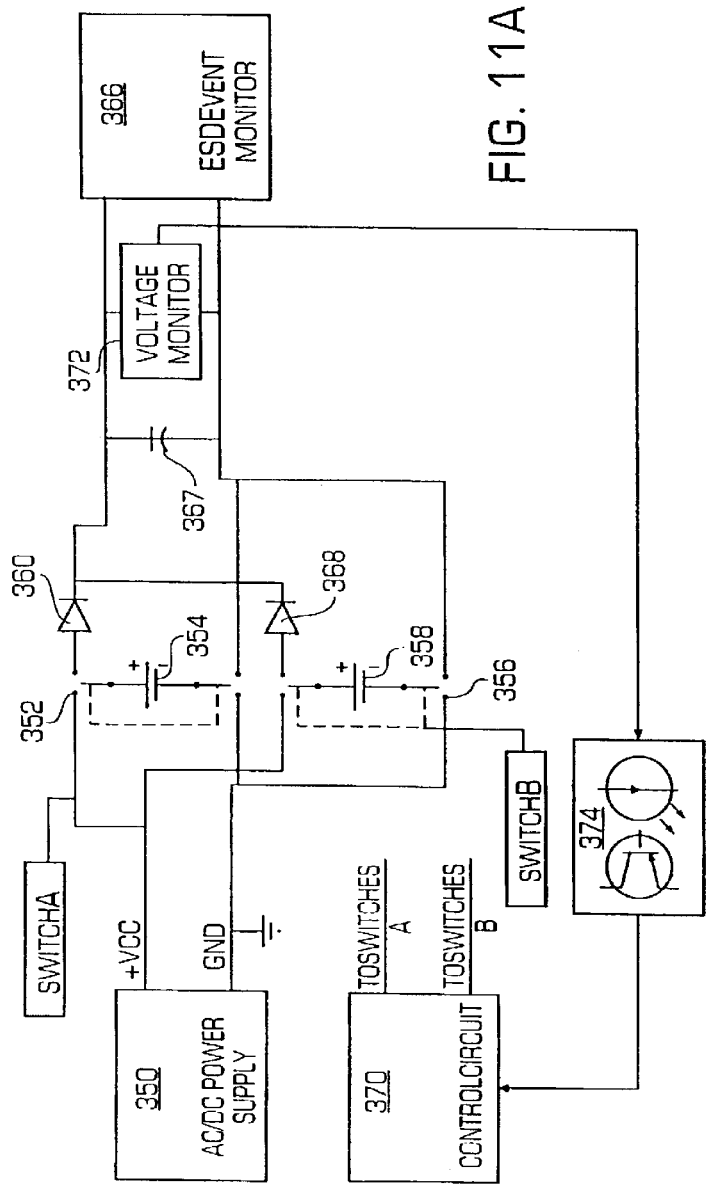
FIGS. 11a and 11b illustrate a second embodiment of an isolated ESD monitoring device in accordance with the invention and timing diagrams for the switches in the device, respectively.
Figure 11B:
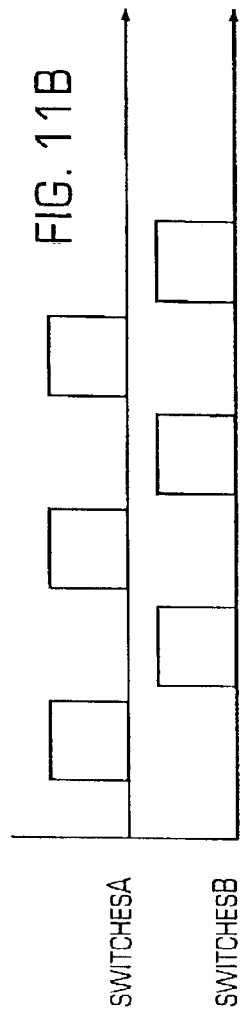

FIGS. 11a and 11b shows another embodiment of the power line isolation technique in accordance with the invention. In particular, the output of power supply 350 is connected to a first switching means 352 as shown. The center contacts of the first switching means are connected to a first storage means 354 that can be implemented as rechargeable battery, a supercap, etc. The power supply is also connected to a second switching means 356 whose central terminals are connected to a second storage means 358. One terminal of the first switching means 352 may be connected via an optional protective diode means 360 to a buffer storage means 362 (implemented as a capacitor, etc.) and to an ESD Event monitor 366. The second switching means are connected to the circuit in a similar way as shown via optional protective diode means 368. A control circuit 370 operates the switching means in a similar manner as in FIG. 10b with non-overlapping timing as shown in FIG. 11b. The control signal for switching in this particular embodiment is supplied by a low-voltage indicator 372 via isolating opto-coupler 374 for isolation. When the voltage on the ESD Event monitor becomes low said low-voltage indicator provides signal to said control circuit to trigger the switching means and to put discharged switching means to charge and to power said ESD Event monitor from freshly-charged other switching means. Said protective diodes are used to assure that there will be no equalizing currents in case control device malfunctions and connects outputs of both storage means in parallel.

The described invention can be implemented in several different ways. The above description also covers a methodology of ESD event detection and monitoring and several possible implementations. Thus, while the foregoing has been with reference to a particular embodiment of the invention, it will be appreciated by those skilled in the art that changes in this embodiment may be made without departing from the principles and spirit of the invention as defined by the attached set of claims.

What is claimed is:

1. A power supply isolation apparatus, comprising:

first switching means that connect a first storage means to the output of a power source;

second switching means that connects said first storage means to a second storage means, the second storage means being connected to the electric load; and a controller for controlling the first and second switching means where both the switching means connect the first storage means alternatively to either said power source or to said second storage means in a non-overlapping manner so that said first storage means charge from said power supply and discharge into said second storage means in a manner where said second storage means and said electric load are never directly connected to said power supply and no interference signal is passed from said power supply.

2. A power supply isolation apparatus, comprising:

a first switching means that connect a first storage means alternatively to either a power supply or to an electric load; and a second switching means that alternatively connect a second storage means to either said power supply or to said electric load where said first switching means and said second switching means operate in a non-overlapping manner when one storage means is connected to said power supply for charging and another previously charged storage means provides power to said electrical load so that said electric load is never directly connected to said power supply and no interference signal is passed from said power supply.

3. The apparatus of claim 2 further comprising a third storage means connected in parallel to said electric load to sustain its voltage during switching transitions and to reduce transient signals generated by said switching transitions.

4. The device of claim 2 further comprising a voltage monitor connected across said electrical load with its output connected to a control circuit, the first output of said controlled means is controlling operation of said first switching means and the second output of said control means is controlling operation of said second switching means where said voltage monitor provides control signal to said control means when the voltage across said electric load drops to preset level and said control circuit in response initiates switching cycle and connects storage means that were providing voltage to said electric load to said power supply for charge and other previously charged storage means to said electric load for providing power.

* * * * *